(12) United States Patent
Thirunavukarasu et al.

(10) Patent No.: US 10,930,542 B2
(45) Date of Patent: Feb. 23, 2021

(54) APPARATUS FOR HANDLING VARIOUS SIZED SUBSTRATES

(71) Applicant: APPLIED MATERIALS, INC., Santa Clara, CA (US)

(72) Inventors: Sriskantharajah Thirunavukarasu, Singapore (SG); Eng Sheng Peh, Singapore (SG); Karrthik Parathithasan, Singapore (SG); Fang Jie Lim, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 37 days.

(21) Appl. No.: 16/272,811

(22) Filed: Feb. 11, 2019

(65) Prior Publication Data

US 2019/0252235 A1    Aug. 15, 2019

Related U.S. Application Data

(60) Provisional application No. 62/631,354, filed on Feb. 15, 2018.

(51) Int. Cl.
*H01L 21/687* (2006.01)
*H01L 21/677* (2006.01)
*H01L 21/683* (2006.01)
*H01L 21/67* (2006.01)

(52) U.S. Cl.
CPC .. *H01L 21/68707* (2013.01); *H01L 21/67184* (2013.01); *H01L 21/67742* (2013.01); *H01L 21/67766* (2013.01); *H01L 21/6838* (2013.01); *H01L 21/68771* (2013.01); *H01L 21/68785* (2013.01)

(58) Field of Classification Search
CPC ..... H01L 21/68707; B25J 9/042; B25J 9/043; B25J 11/0095
See application file for complete search history.

(56) References Cited

U.S. PATENT DOCUMENTS

| | | | | |
|---|---|---|---|---|
| 2,535,489 A | * | 12/1950 | Edwards | A61F 2/58 623/24 |
| 5,656,088 A | * | 8/1997 | Sugimoto | B05C 3/04 118/423 |
| 6,109,677 A | * | 8/2000 | Anthony | B25J 15/0253 294/103.1 |
| 6,213,704 B1 | | 4/2001 | White et al. | |
| 10,322,513 B2 | * | 6/2019 | Todorov | B25J 11/0095 |
| 2007/0029227 A1 | * | 2/2007 | Bonora | B65G 65/00 206/711 |
| 2009/0173560 A1 | * | 7/2009 | Nakamoto | B25J 5/00 180/167 |

(Continued)

FOREIGN PATENT DOCUMENTS

JP    2012216573 A  *  11/2012

*Primary Examiner* — Gerald McClain
(74) *Attorney, Agent, or Firm* — Moser Taboada

(57) ABSTRACT

Embodiments of methods and apparatus for handling substrates of different sizes are provided herein. In some embodiments, an apparatus for handling substrates of different sizes includes: a pair of end effectors having a first set of contact pads configured to support a substrate having a first size and a second set of contact pads configured to support a substrate having a second size, smaller than the first size.

19 Claims, 4 Drawing Sheets

(56) References Cited

U.S. PATENT DOCUMENTS

| | | | |
|---|---|---|---|
| 2010/0298974 A1* | 11/2010 | Okahisa | B25J 9/044 |
| | | | 700/230 |
| 2012/0010749 A1* | 1/2012 | van der Merwe | A61F 2/68 |
| | | | 700/264 |
| 2014/0017042 A1* | 1/2014 | Rodnick | H01L 21/68707 |
| | | | 414/222.07 |
| 2014/0033852 A1* | 2/2014 | Chen | B65G 49/061 |
| | | | 74/490.05 |
| 2017/0225322 A1* | 8/2017 | Wariishi | B25J 11/00 |
| 2018/0068881 A1* | 3/2018 | Cavins | H01L 21/67727 |

\* cited by examiner

APPARATUS FOR HANDLING VARIOUS SIZED SUBSTRATES

CROSS-REFERENCE TO RELATED APPLICATIONS

This application claims benefit of U.S. provisional patent application Ser. No. 62/631,354, filed Feb. 15, 2018 which is herein incorporated by reference in its entirety.

FIELD

Embodiments of the present disclosure generally relate to substrate processing equipment, and more particularly, to methods and apparatus for handling substrates of different sizes.

BACKGROUND

In semiconductor fabrication industries, precise and careful handling of substrates, such as semiconductor wafers, are a critical aspect of substrate processing. Automation, such as by substrate handling robots with end effectors designed to handle wafers, is used to perform complex hand off tasks as well as to reduce or isolate any external contamination. Such substrate handling robots transfer substrates, such as wafers, from one location to another, pick up and drop off substrates from one station to another within the system, etc. Typically, the substrate handling robots are designed and built to handle one type of substrate size, depending, for example, on system capabilities and configuration. As an example, some systems may be configured to process 200 mm wafers, or 300 mm wafers, or the like.

With the advancement of technologies and more compact, smaller electronic devices with high computing power, industries have shifted their focus from 200 mm to 300 mm wafers. As processing of 300 mm wafers becomes more dominant in the market, demand for tools with 300 mm processing capabilities increases, leading tool manufacturers to design and build more 300 mm tools, slowly phasing out 200 mm tools.

However, despite the transition to 300 mm substrate processing, many chipmakers still have a large quantity of 200 mm substrates in their respective inventories. The inventors believe that such chipmakers and others with a desire to process 200 mm substrates, may not wish to purchase 200 mm tools that may soon be obsolete.

Accordingly, the inventors have provided improved methods and apparatus that enable substrate handling robots to handle differently sized substrates, such as 200 mm and 300 mm wafers.

SUMMARY

Embodiments of methods and apparatus for handling substrates of different sizes are provided herein. In some embodiments, an apparatus for handling substrates of different sizes includes: a pair of end effectors having a first set of contact pads configured to support a substrate having a first size and a second set of contact pads configured to support a substrate having a second size, smaller than the first size.

In some embodiments, a multi-chamber substrate processing tool, comprising: a factory interface (FI) in selective communication with a load lock chamber; a first front opening unified pod (FOUP) disposed on or coupled to the FI and configured to provide substrates having a first size to or from the multi-chamber substrate processing tool; a second FOUP disposed on or coupled to the FI and configured to provide substrates having a second size to or from the multi-chamber substrate processing tool; and a robot disposed in the factory interface, wherein the robot includes a pair of end effectors configured to support substrates having both the first size and the second size, the second size smaller than the first size.

In some embodiments, a method of handling substrates of different sizes, comprising: rotating a pair of end effectors of a substrate handling robot in a tool configured to process substrates to a first position to support a substrate having a first size; and rotating the pair of end effectors to a second position to support a substrate having a second size.

Other and further embodiments of the present invention are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
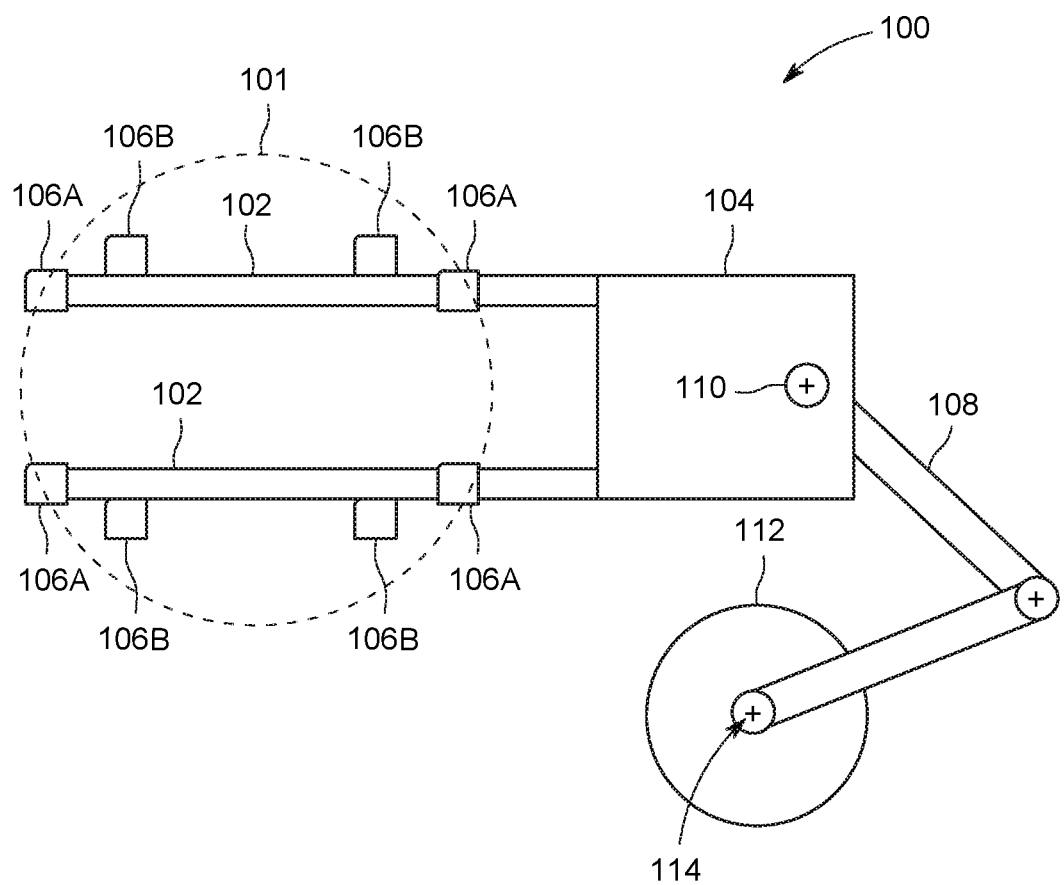
FIGS. 1A-1B are schematic top views of an apparatus for handling substrates of different sizes in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for handling substrates of different sizes are provided herein. Embodiments of the disclosed methods and apparatus advantageously enable substrate handling robots to handle differently sized substrates. For example, the apparatus for handling substrates of different sizes can handle substrates having a first size (such as a wafer having a first diameter, for example 300 mm, or the like) as well as substrates having a second size smaller than the first size (for example a wafer having a second diameter, for example 200 mm). Thus, embodiments of the disclosed methods and apparatus advantageously enable substrate handling robots, such as a substrate handling robot in a 300 mm processing tool, to handle differently sized substrates, such as both 200 mm and 300 mm wafers, or other combinations. Moreover, the improved apparatus can advantageously be retrofitted on an existing substrate handling robot by replacing the end effector on the robot without replacing the entire substrate handling robot or worrying about incompatibility of the factory interface (FI) with the substrate handling robot.

Embodiments of apparatus for handling substrates of different sizes disclosed herein advantageously enable a substrate handling apparatus configured for handling substrates of a first size to handle substrates having different sizes. Substrates can be round substrates, such as 200 or 300 mm wafers or the like, or substrates having other form factors, such as rectangular or polygonal substrates, for example, rectangular glass substrates used in solar, display, or other applications. For example, a substrate handling robot in a tool configured to process 300 mm wafers can be replaced or modified in accordance with the teachings disclosed herein to enable handling of, for example, both 200 mm and 300 mm wafers. As such, the substrate handling robot can process either 200 mm, 300 mm, or both 200 mm and 300 mm wafer processes at any given point in time. Further advantageously, the end effector on the substrate handling robot can be modified in accordance with the teachings disclosed herein without replacing the entire robot or worrying about incompatibility with the FI.

Figure 1B:
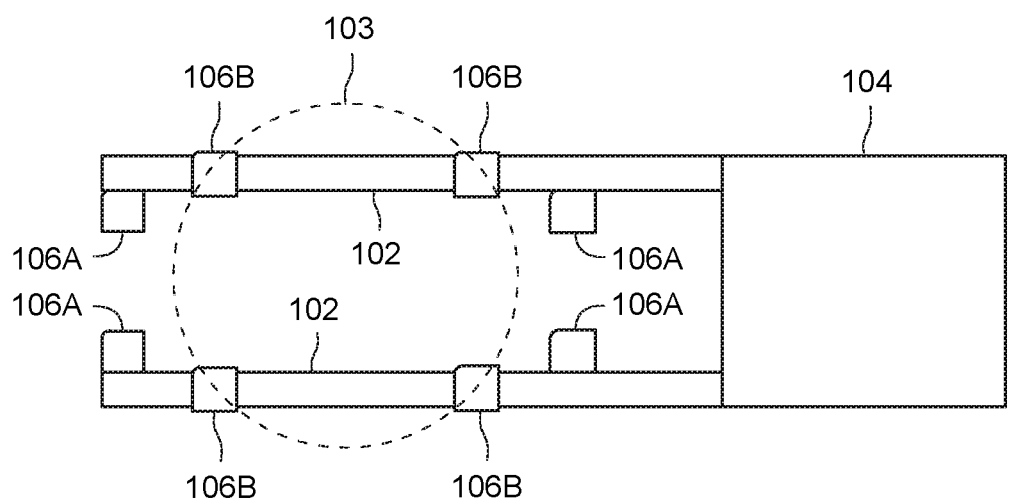

FIGS. 1A-1B are schematic top views of an apparatus 100 for handling substrates of different sizes in accordance with at least some embodiments of the present disclosure. The apparatus 100 is suitable for use in connection with a substrate processing tool configured to process substrates having a first size, such as the multi-chamber substrate processing tool 400 discussed below with respect to FIG. 4.

In some embodiments, the apparatus 100 includes a pair end effectors 102 coupled to a support plate 104. The support plate 104 provides support and distributes the weight of the load on the end effectors 102 during substrate pick up and transfer. The end effectors 102 are easily removable from the support plate 104 to facilitate repair, reconfiguration, replacement, or the like.

The end effectors 102 include a first set of contact pads 106A and a second set of contact pads 106B. The end effectors 102 and first and second sets of contact pads 106A, 106B are configured to pass through openings in the processing system to enable handling and transfer of substrates throughout the processing system.

The first set of contact pads 106A are configured to support a substrate having a first size. The second set of contact pads 106B are configured to support a substrate having a second size, smaller than the first size. The first and second contact pads 106A, 106B are further configured to not interfere with each other. For example, the first set of contact pads 106A can support a first substrate (indicated by dashed line 101) having the first size without the first substrate contacting the second set of contact pads 106B. Similarly, the second set of contact pads 106B can support a second substrate (indicated by dashed line 103) having the second size without the second substrate contacting the first set of contact pads 106A. As such, the apparatus 100 can advantageously handle warped substrates due to the clearance provided by the configuration of the contact pads and end effectors.

The contact pads of the first and second sets of contact pads 106A, 106B can be any suitable contact pads for supporting substrates in substrate processing systems. For example, the contact pads may comprise edge grips, or edge contact pads, for supporting substrates by their peripheral edge. Other types of contact pads may also be used. Moreover, the position of the contact pads can be selected to handle substrates of desired sizes, depending upon processing needs.

The end effectors 102 can selectively support either larger or smaller substrates. For example, in some embodiments and as shown more clearly in FIGS. 2A-B and 3A-B, the end effectors 102 are rotatable, either partially or freely, with respect to the support plate 104, such that the rotational orientation of each end effector 102 can be controlled to appropriately position either the first set of contact pads 106A or the second set of contact pads 106B for use, with the unselected set of contact pads disposed in a position that does not obstruct use of the selected set of contact pads.

Figure 2A:
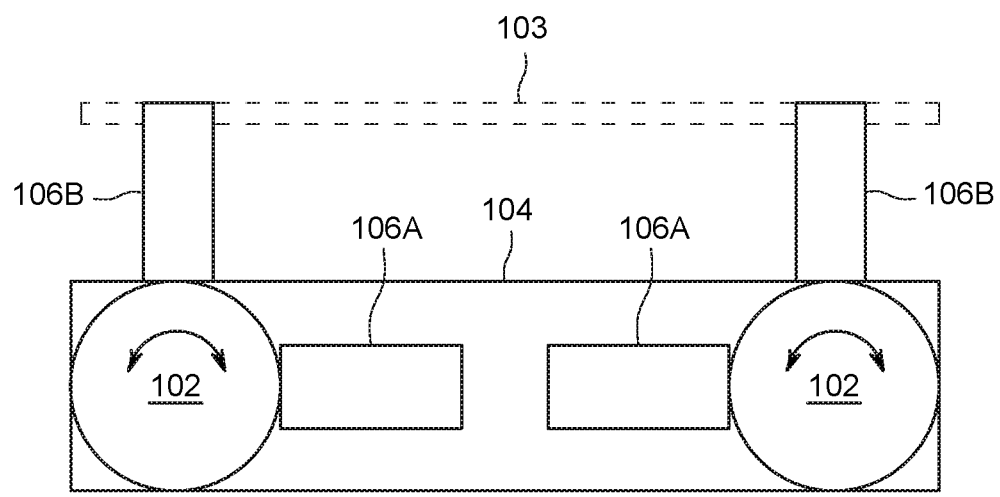
FIGS. 2A-2B are schematic front views of the apparatus for handling substrates of different sizes of FIG. 1 in accordance with at least some embodiments of the present disclosure.
Figure 2B:
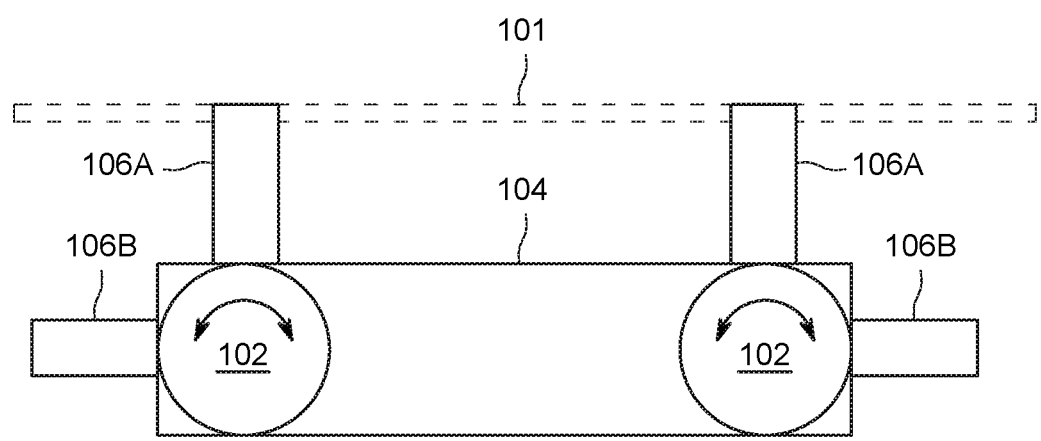
Figure 3A:
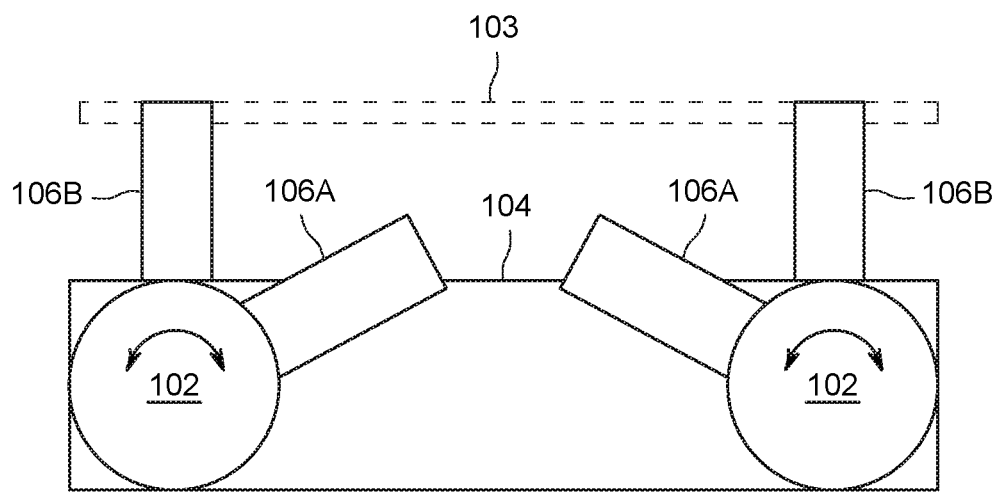
FIGS. 3A-3B are schematic alternate front views of the apparatus for handling substrates of different sizes of FIG. 1 in accordance with at least some embodiments of the present disclosure.
Figure 3B:
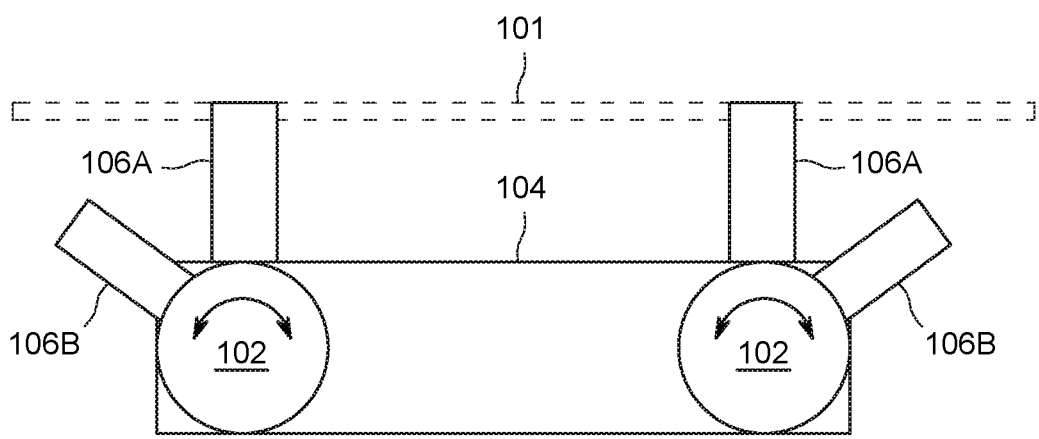

For example, in some embodiments, and depending on the substrate sizes intended to be processed, two contact pads are disposed on each end effector 102 at positions corresponding to the first substrate size, defining a first set of contact pads. Two contact pads are disposed on each end effector 102 at positions corresponding to the second substrate size, defining a second set of contact pads. The first and second sets of contact pads are placed radially apart from each other, such as about 90 degrees apart from each other (as depicted in FIGS. 2A-2B), or at a smaller angle that still provides clearance between the contact pads (as depicted in FIGS. 3A-3B). In some embodiments, the relative angular position of the contact pads is measured with respect to an elongate axis of the end effector.

For example, FIGS. 2A-2B are schematic front views of the apparatus for handling substrates of different sizes of FIG. 1 in accordance with at least some embodiments of the present disclosure. In FIG. 2A, the end effectors 102 are rotated such that the second set of contact pads 106B are positioned for supporting a substrate having the second size (e.g., a smaller substrate), as indicated by dashed lines 103. In FIG. 2B, the end effectors 102 are rotated such that the first set of contact pads 106A are positioned for supporting a substrate having the first size (e.g., a larger substrate), as indicated by dashed lines 101.

FIGS. 3A-3B are schematic alternate front views of the apparatus for handling substrates of different sizes of FIG. 1 in accordance with at least some embodiments of the present disclosure. In FIG. 3A, the end effectors 102 are rotated such that the second set of contact pads 106B are positioned for supporting a substrate having the second size (e.g., a smaller substrate), as indicated by dashed lines 103. In FIG. 3B, the end effectors 102 are rotated such that the first set of contact pads 106A are positioned for supporting a substrate having the first size (e.g., a larger substrate), as indicated by dashed lines 101. As the sets of contact pads in FIGS. 3A-3B are angularly closer to each other, the end effectors 102 do not need to rotate as much to switch configurations.

During operation, the end effectors can rotate to position a set of contact pads into a first position before picking up a substrate, such as for example, before entering a FOUP (Front Opening Unified Pod). Once in position, the substrate handling apparatus will extend the end effectors 102 into the FOUP. At the end of the extended position, the end effectors 102 can rotate to a second position where the set of contact pads (e.g., edge grip pads) come in contact with the substrate. The substrate will then be retained on the end effectors 102 before the apparatus 100 retracts and transfers the substrate to other locations. The rotational operation of the end effectors can be reversed to release a substrate when placing the substrate on a support.

In some embodiments, the apparatus 100 may be incorporated into a substrate transfer robot. For example, returning to FIG. 1A, the support plate 104 may be configured as a wrist of a substrate transfer robot. The wrist supports each end effector 102 in a fixed position relative to each other such that control over the movement of the wrist facilitates control over the position of the end effectors 102. The wrist is coupled to an arm 108 capable of moving the wrist (and the end effectors 102) in a horizontal direction, such as to extend horizontally through an opening in a FOUP or process chamber to deliver or receive substrates to the FOUP or the process chamber. In some embodiments, the wrist is capable of at least one of horizontal or vertical rotational motion with respect to the arm, such as, for example, by being coupled to the arm via a hinge, a pin, a pivotable joint, a flexure, or the like (pivotable joint 110 shown). The arm 108 may be a compound arm comprising a plurality of sections and joints to facilitate more complex movement. In some embodiments, the arm 108 may be coupled to an assembly 112 for providing vertical and/or rotational movement of the arm about a central axis 114. Such vertical and/or rotational movement of the arm facilitates moving the wrist (and the end effectors 102) vertically and/or rotationally as needed to deliver or receive substrates as desired.

The components of the apparatus 100, and the substrate transfer robot (e.g., the arm, the wrist, the end effectors, or the like) may be fabricated from any process suitable materials. For example, in some embodiments, materials may be selected to minimize deflection of the robot blades during the substrate transfer. In some embodiments, materials may be selected to minimize contamination of the substrate by the robot blades during the substrate transfer. In some embodiments where transfers are being made to or from a chamber at a high temperature, materials may be selected to minimize thermal effects during the substrate transfer.

Figure 4:
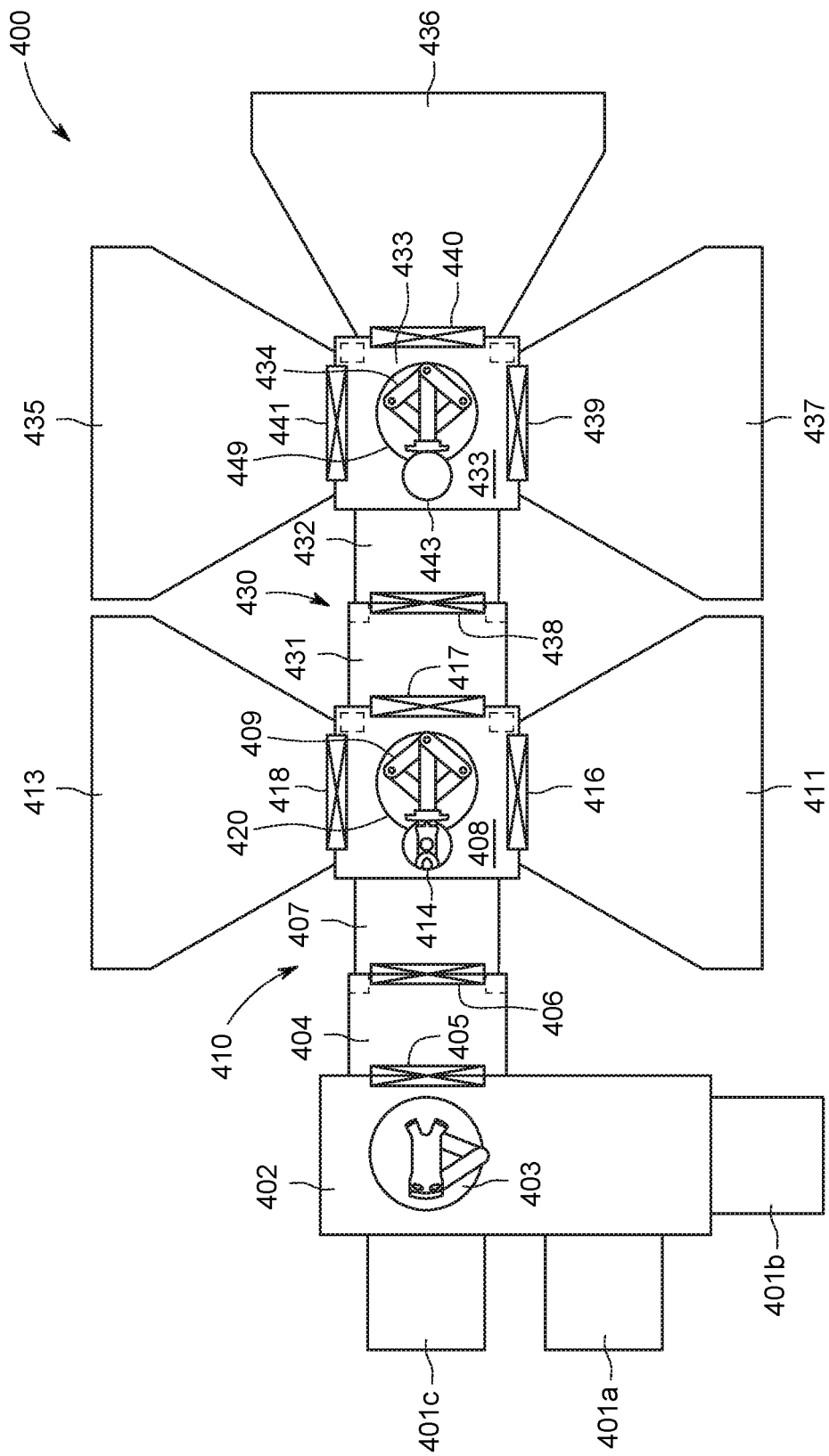
FIG. 4 is a plan view of a multi-chamber cluster tool suitable to perform methods for processing of different sizes in accordance with some embodiments of the present disclosure.

FIG. 4 schematically illustrates a plan view of a non-limiting example of an integrated multi-chamber substrate processing tool 400 having an apparatus for handling substrates of different sizes in accordance with the present disclosure. Examples of tools suitable for modification and use in accordance with the present disclosure include the APPLIED CHARGER®, CENTURA®, ENDURA®, and PRODUCER® line of integrated substrate processing tools, available from Applied Materials, Inc., of Santa Clara, Calif. The multi-chamber substrate processing tool 400 comprises multiple processing chambers coupled to a mainframe comprising two transfer chambers (e.g., a transfer chamber 408 and a transfer chamber 433).

The multi-chamber substrate processing tool 400 comprises a front-end environment factory interface (FI) 402 in selective communication with a load lock chamber 404. The multi-chamber substrate processing tool 400 is generally configured to process substrates having a first size (such as a wafer having a first diameter, for example 300 mm, or the like). One or more front opening unified pods (FOUPs), for example FOUP 401a and FOUP 401b, are disposed on or coupled to the FI 402 to provide substrates to or receive substrates from the multi-chamber substrate processing tool 400. In some embodiments, a bridging FOUP 401c is provided to enable processing of substrates having a second size smaller than the first size (for example a wafer having a second diameter, for example 200 mm). The bridging FOUP 401c is disposed on or coupled to the FI 402. In some embodiments, the bridging FOUP 401c can be configured to hold substrate carriers of the first size (e.g., 300 mm) with substrates having the second size (e.g., 200 mm) disposed thereon.

A factory interface robot 403 is disposed in the FI 402. The factory interface robot 403 can incorporate any of the embodiments of the apparatus 100 for handling substrates of different sizes as discussed above. The factory interface robot 403 is configured to transfer substrates to/from the FOUPs 401a, 401b, and the bridging FOUP 401c, as well as between the bridging FOUP 401c and the load lock chamber 404. In one example of operation, the factory interface robot 403 takes a substrate carrier from FOUP 401a, and places the substrate carrier in the bridging FOUP 401c. The substrate carrier has a first size, for example a 300 mm diameter. Subsequently, the factory interface robot 403 then takes a substrate from FOUP 401b and places the substrate on the substrate carrier within the bridging FOUP 401c. The substrate has a second size smaller than the first size, for example a 200 mm diameter. Next, the factory interface robot 403 can transfer the carrier holding the substrate together to the load lock chamber 404 so that the substrate having the second size can be processed in the multi-chamber substrate processing tool 400. In such an example, the substrate transfer apparatus 100 advantageously enables a process tool, such as the multi-chamber substrate processing tool 400, configured for processing substrates having a first size, to process substrates having a second size, smaller than the first size, by facilitating handling of multiple sized substrates with a single substrate handling apparatus.

The load lock chamber 404 provides a vacuum interface between the FI 402 and a first transfer chamber assembly 410. An internal region of the first transfer chamber assembly 410 is typically maintained at a vacuum condition and provides an intermediate region in which to shuttle substrates, or substrate carriers holding substrates, from one chamber to another and/or to a load lock chamber.

In some embodiments, the first transfer chamber assembly 410 is divided into two parts. In some embodiments of the present disclosure, the first transfer chamber assembly 410 comprises the transfer chamber 408 and a vacuum extension chamber 407. The transfer chamber 408 and the vacuum extension chamber 407 are coupled together and in fluid communication with one another. An inner volume of the first transfer chamber assembly 410 is typically maintained at low pressure or vacuum condition during process. The load lock chamber 404 may be connected to the FI 402 and the vacuum extension chamber 407 via slit valves 405 and 406 respectively.

In some embodiments, the transfer chamber 408 may be a polygonal structure having a plurality of sidewalls, a bottom and a lid. The plurality of sidewalls may have openings formed therethrough and are configured to connect with processing chambers, vacuum extension and/or pass through chambers. The transfer chamber 408 shown in FIG. 4 has a square or rectangular shape and is coupled to processing chambers 411, 413, a pass through chamber 431 and the vacuum extension chamber 407. The transfer chamber 408 may be in selective communication with the processing chambers 411, 413, and the pass through chamber 431 via slit valves 416, 418, and 417 respectively.

In some embodiments, a central robot 409 may be mounted in the transfer chamber 408 at a robot port formed on the bottom of the transfer chamber 408. The central robot 409 is disposed in an internal volume 420 of the transfer chamber 408 and is configured to shuttle substrates 414 (or substrate carriers holding substrates) among the processing chambers 411, 413, the pass through chamber 431, and the load lock chamber 404. In some embodiments, the central robot 409 may include two blades for holding substrates, or substrate carriers holding substrates, each blade mounted on an independently controllable robot arm mounted on the same robot base. In another embodiment, the central robot 409 may have the capacity for vertically moving the blades.

The vacuum extension chamber 407 is configured to provide an interface to a vacuum system to the first transfer chamber assembly 410. In some embodiments, the vacuum extension chamber 407 comprises a bottom, a lid and sidewalls. A pressure modification port may be formed on the bottom of the vacuum extension chamber 407 and is configured to adapt to a vacuuming pump system. Openings are formed on the sidewalls so that the vacuum extension chamber 407 is in fluid communication with the transfer chamber 408, and in selective communication with the load lock chamber 404.

In some embodiments, the vacuum extension chamber 407 comprises a shelf (not shown) configured to store one or more substrates or substrate carriers holding substrates. Processing chambers directly or indirectly connected to the transfer chamber 408 may store their substrates or substrate carriers holding substrates on the shelf and use the central robot 409 to transfer them.

The multi-chamber substrate processing tool 400 can further comprise a second transfer chamber assembly 430 connected to the first transfer chamber assembly 410 by the pass through chamber 431. In some embodiments, the pass through chamber 431, similar to a load lock chamber, is configured to provide an interface between two processing environments. In such embodiments, the pass through chamber 431 provides a vacuum interface between the first transfer chamber assembly 410 and the second transfer chamber assembly 430.

In some embodiments, the second transfer chamber assembly 430 is divided into two parts to minimize the footprint of the multi-chamber substrate processing tool 400. In some embodiments of the present disclosure, the second transfer chamber assembly 430 comprises the transfer chamber 433 and a vacuum extension chamber 432 in fluid communication with one another. An inner volume of the second transfer chamber assembly 430 is typically maintained at low pressure or vacuum condition during processing. The pass through chamber 431 may be connected to the transfer chamber 408 and the vacuum extension chamber 432 via slit valves 417 and 438 respectively so that the pressure within the transfer chamber 408 may be maintained at different vacuum levels.

In some embodiments, the transfer chamber 433 may be a polygonal structure having a plurality of sidewalls, a bottom and a lid. The plurality of sidewalls may have openings formed therein and are configured to connect with processing chambers, vacuum extension and/or pass through chambers. The transfer chamber 433 shown in FIG. 4 has a square or rectangular shape and is coupled with processing chambers 435, 436, 437, and the vacuum extension chamber 432. The transfer chamber 433 may be in selective communication with the processing chambers 435, 436, via slit valves 441, 440, 439 respectively.

A central robot 434 is mounted in the transfer chamber 433 at a robot port formed on the bottom of the transfer chamber 433. The central robot 434 is disposed in an internal volume 449 of the transfer chamber 433 and is configured to shuttle substrates 443 (or substrate carriers holding substrates) among the processing chambers 435, 436, 437, and the pass through chamber 431. In some embodiments, the central robot 434 may include two blades for holding substrates, or holding substrate carriers 132 holding substrates, each blade mounted on an independently controllable robot arm mounted on the same robot base. In some embodiments, the central robot 434 may have the capacity for moving the blades vertically.

In some embodiments, the vacuum extension chamber 432 is configured to provide an interface between a vacuum system and the second transfer chamber assembly 430. In some embodiments, the vacuum extension chamber 432 comprises a bottom, a lid and sidewalls. A pressure modification port may be formed on the bottom of the vacuum extension chamber 432 and is configured to adapt to a vacuum system. Openings are formed through the sidewalls so that the vacuum extension chamber 432 is in fluid communication with the transfer chamber 433, and in selective communication with the pass through chamber 431.

In some embodiments of the present disclosure, the vacuum extension chamber 432 includes a shelf (not shown), similar to that described in connection with the vacuum extension chamber 407 above. Processing chambers directly or indirectly connected to the transfer chamber 433 may store substrates or substrate carriers holding substrates on the shelf.

Typically, substrates are processed in a sealed chamber having a pedestal for supporting a substrate disposed thereon. The pedestal may include a substrate support that has electrodes disposed therein to electrostatically hold the substrate, or hold the substrate carriers holding substrates, against the substrate support during processing. For processes tolerant of higher chamber pressures, the pedestal may alternately include a substrate support having openings in communication with a vacuum source for securely holding a substrate against the substrate support during processing.

Processes that may be performed in any of the processing chambers 411, 413, 435, 436, or 437, include deposition, implant, and thermal treatment processes, among others. In some embodiments, a processing chamber such as any of the processing chambers 411, 413, 435, 436, or 437, is configured to perform a sputtering process on a substrate, or on multiple substrates simultaneously. In some embodiments, processing chamber 411 is a degas chamber. In some embodiments, the processing chamber 413 is a pre-metallization clean chamber. The pre-metallization clean chamber can use a sputtering clean process comprising an inert gas, such as argon. In some embodiments, the processing chamber 435 is a deposition chamber. The deposition chamber used with embodiments described here can be any known deposition chamber.

While the foregoing is directed to embodiments of the present disclosure, other and further embodiments of the disclosure may be devised without departing from the basic scope thereof.

The invention claimed is:

1. Apparatus for handling substrates of different sizes, comprising:
 a pair of end effectors coupled to a support plate and having a first set of contact pads together configured to support a substrate having a first size and a second set of contact pads together configured to support a substrate having a second size, smaller than the first size, wherein the first set of contact pads and the second set of contact pads are positioned at an angle to each other with respect to an elongate axis of each respective end effector, wherein each of the pair of end effectors are rotatable with respect to the elongate axis thereof, and to the support plate, such that the rotation of each of the end effectors about their respective elongate axes positions the first set of contact pads or the second set of contact pads for receiving the substrate, and wherein the pair of end effectors are constrained with respect to each other and the support plate in all dimensions except for rotation along the respective elongate axis of each of the pair of end effectors.

2. The apparatus of claim 1, wherein the second set of contact pads are disposed at a location on each end effector between a location of adjacent contact pads of the first set of contact pads.

3. The apparatus of claim 1, wherein the support plate is configured as a wrist of a substrate transfer robot and coupled to an arm of the substrate transfer robot.

4. The apparatus of claim 1, wherein the first set of contact pads and second set of contact pads are edge grip pads.

5. The apparatus of claim 1, wherein the angle is greater than zero and up to about 90 degrees.

6. The apparatus of claim 1, wherein two contact pads are disposed on each end effector to define the first set of contact pads.

7. The apparatus of claim 1, wherein two contact pads are disposed on each end effector to define the second set of contact pads.

8. A multi-chamber substrate processing tool, comprising:
a factory interface (FI) in selective communication with a load lock chamber;
a first front opening unified pod (FOUP) disposed on or coupled to the FI and configured to provide substrates having a first size to or from the multi-chamber substrate processing tool;
a second FOUP disposed on or coupled to the FI and configured to provide substrates having a second size, smaller than the first size, to or from the multi-chamber substrate processing tool; and
a robot disposed in the factory interface, wherein the robot includes a pair of end effectors coupled to a support plate and having a first set of contact pads together configured to support substrates having the first size and a second set of contact pads together configured to support substrates having the second size, wherein the first set of contact pads and the second set of contact pads are positioned at an angle to each other with respect to an elongate axis of each respective end effector, wherein each of the pair of end effectors are rotatable with respect to the elongate axis thereof such that the rotation of each of the end effectors about the elongate axes positions the first set of contact pads or the second set of contact pads for receiving the substrate, and wherein the pair of end effectors are constrained with respect to each other and the support plate in all dimensions except for rotation.

9. The multi-chamber substrate processing tool of claim 8, wherein the support plate is coupled to an arm of the robot.

10. The multi-chamber substrate processing tool of claim 9, wherein the pair of end effectors are rotatable with respect to the support plate to position the pair of end effectors to receive the substrate having either the first size or the second size.

11. The multi-chamber substrate processing tool of claim 8, wherein the pair of end effectors include a first set of contact pads configured to support a substrate having the first size and a second set of, contact pads configured to support a substrate having the second size.

12. The multi-chamber substrate processing tool of claim 11, wherein two contact pads are disposed on each end effector to define the first set of contact pads and two contact pads are disposed on each end effector to define the second set of contact pads.

13. The multi-chamber substrate processing tool of claim 12, wherein the angle is greater than zero and up to about 90 degrees.

14. A method of handling substrates of different sizes, comprising:
rotating a pair of end effectors with respect to a support plate of a substrate handling robot in a tool configured to process substrates Doll from a first position to support a substrate having a first size
to a second position to support a substrate having a second size, wherein the pair of end effectors are rotated together along respective elongate axes of each end effector, and wherein the pair of end effectors are constrained with respect to each other and the support plate in all dimensions except for rotation along the respective elongate axis of each of the pair of end effectors.

15. The method of claim 14, wherein the second size is smaller than the first size.

16. The method of claim 14, wherein the pair of end effectors include a first set of contact pads to support the substrate having the first size and a second set of contact pads to support the substrate having the second size.

17. The method of claim 14, wherein rotating the pair of end effectors to the second position includes rotating the pair of end effectors up to about 90 degrees with respect to the elongate axis of each of the respective end effectors.

18. The method of claim 14, further comprising releasing the substrate having the first size prior to rotating the pair of end effectors to the second position.

19. The method of claim 18, further comprising picking up the substrate having the first size prior to releasing the substrate having the first size.

* * * * *